United States Patent
Ma et al.

(10) Patent No.: US 9,460,932 B2
(45) Date of Patent: Oct. 4, 2016

(54) SURFACE POISONING USING ALD FOR HIGH SELECTIVITY DEPOSITION OF HIGH ASPECT RATIO FEATURES

(71) Applicant: Applied Materials, Inc., Santa Clara, CA (US)

(72) Inventors: Paul F. Ma, Santa Clara, CA (US); Jiang Lu, Santa Clara, CA (US); Guodan Wei, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/538,292

(22) Filed: Nov. 11, 2014

(65) Prior Publication Data

US 2015/0132951 A1     May 14, 2015

Related U.S. Application Data

(60) Provisional application No. 61/902,578, filed on Nov. 11, 2013.

(51) Int. Cl.
| | | |
|---|---|---|
| *H01L 21/3205* | (2006.01) | |
| *H01L 21/285* | (2006.01) | |
| *H01L 21/768* | (2006.01) | |

(52) U.S. Cl.
CPC ... *H01L 21/28562* (2013.01); *H01L 21/76846* (2013.01); *H01L 21/76849* (2013.01)

(58) Field of Classification Search
None
See application file for complete search history.

(56) References Cited

U.S. PATENT DOCUMENTS

| | | | | |
|---|---|---|---|---|
| 7,829,150 B2 * | 11/2010 | Engstrom | ............ | B05D 1/185 427/255.4 |
| 2002/0182320 A1 | 12/2002 | Leskela et al. | | |
| 2003/0124262 A1 | 7/2003 | Chen et al. | | |
| 2004/0087176 A1 * | 5/2004 | Colburn | ............ | H01L 21/0331 438/758 |
| 2005/0182320 A1 | 8/2005 | Stifter et al. | | |
| 2006/0013943 A1 | 1/2006 | Chen et al. | | |
| 2007/0082487 A1 * | 4/2007 | Chiang | ............ | B82Y 30/00 438/687 |
| 2007/0209925 A1 | 9/2007 | Tang et al. | | |
| 2007/0251445 A1 | 11/2007 | Ishizaka | | |
| 2008/0038463 A1 | 2/2008 | Chen et al. | | |
| 2008/0199601 A1 | 8/2008 | Gonohe et al. | | |
| 2008/0242082 A1 | 10/2008 | Yang et al. | | |
| 2009/0053888 A1 | 2/2009 | Ding et al. | | |
| 2009/0081827 A1 | 3/2009 | Yang et al. | | |
| 2009/0142491 A1 | 6/2009 | Nakamura et al. | | |
| 2009/0191721 A1 * | 7/2009 | Cerio, Jr. | ............ | C23C 14/046 438/785 |
| 2009/0202710 A1 * | 8/2009 | Marcadal | ............ | C23C 16/18 427/126.1 |
| 2010/0215842 A1 | 8/2010 | Chen et al. | | |
| 2010/0279498 A1 * | 11/2010 | Lo | ............ | H01L 21/28079 438/592 |

(Continued)

OTHER PUBLICATIONS

Burton, B.B., et al., Tantalum Nitride Atomic Layer Deposition Using (tert-Butylimido)tris(diethylamido)tantalum and Hydrazine, *Journal of the Electrochemical Society* vol. 155 No. 7 2008, D508-D516.

(Continued)

*Primary Examiner* — Alexander Ghyka
(74) *Attorney, Agent, or Firm* — Servilla Whitney LLC

(57) ABSTRACT

Methods of selectively depositing a feature onto a substrate surface while maintaining substantially straight sidewalls on the feature. A portion of the feature is grown and then covered with a protective film. The protective film is removed from the top of the feature, leaving some of the film on the sides of the feature and the process is repeated to grow a feature of desired thickness.

19 Claims, 2 Drawing Sheets

(56) References Cited

U.S. PATENT DOCUMENTS

| | | | |
|---|---|---|---|
| 2011/0122552 A1* | 5/2011 | Levy | C23C 16/02 361/679.01 |
| 2011/0318505 A1 | 12/2011 | Yamamoto et al. | |
| 2013/0243956 A1* | 9/2013 | Ma | C23C 16/04 427/255.394 |
| 2013/0340648 A1* | 12/2013 | Kong | C23C 18/44 106/1.24 |
| 2015/0118848 A1* | 4/2015 | Draeger | H01L 21/02164 438/696 |

OTHER PUBLICATIONS

Chen, F., et al., A Comparative Study of ULK Conduction Mechanisms and TDDB Characteristics for Cu Interconnects with and without CoWP Metal Cap at 32-nm Technology, *IBM and Lam Research Corp., IEEE ITC Conference* Mar. 26, 2010, 1 page.

Fuji, Masayoshi, et al., Wettability of fine silica powder surfaces modified with several normal alcohols, *Colloids and Surfaces A: Physicochemical and Engineering Aspects* vol. 154 1999, 13-24.

Leskela, Markku, et al., Atomic layer deposition (ALD): from precursors to thin film structures, *Thin Solid Films* vol. 409 2002, 138-146.

Ricci, Anthony, Point of Use (POU) Gas Purification for Atomic Layer Deposition (ALD) Processes, *Pall Microelectronics*, ABG-105-0305 2005, 3 pages.

Satta, Alessandra, et al., The Removal of Copper Oxides by Ethyl Alcohol Monitored In Situ by Spectroscopic Ellipsometry, *Journal of the Electrochemical Society* vol. 150 No. 5 2003, G300-G306.

Yang, C.C., et al., Co Capping Layers for Cu/Low-k Interconnects, *Microelectric Engineering*, vol. 92, 27th Annual Advanced Metallization Conference 2010 published Apr. 2012, 79-82.

* cited by examiner

SURFACE POISONING USING ALD FOR HIGH SELECTIVITY DEPOSITION OF HIGH ASPECT RATIO FEATURES

CROSS-REFERENCE TO RELATED APPLICATIONS

This application claims priority to U.S. Provisional Application No. 61/902,578, filed Nov. 11, 2013, the entire disclosure of which is hereby incorporated by reference herein.

FIELD

Embodiments of the disclosure relate to the processing of semiconductor substrates. More particularly, embodiments of the disclosure relate to methods for the low temperature deposition of, for example, cobalt or cobalt silicide layers on semiconductor substrates using atomic layer deposition techniques.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with atomic layer control and conformal deposition is atomic layer deposition (ALD), which employs sequential, surface reactions to form layers of precise thickness controlled at the Angstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited. The self-limiting nature of the surface reactions also allows the reaction to be driven to completion during every reaction cycle, resulting in films that are continuous and pinhole-free.

During the manufacture of integrated circuits, there is often a need to deposit films onto metal regions while avoiding dielectric surfaces, and vice versa. The ability to selectively deposit a high aspect ratio feature with straight sidewalls is highly desirable for possible patterning applications. Conventional processes result in the growth of a mushroom shaped feature which is undesirable. Therefore, there is a need in the art for processes for depositing a high aspect ratio feature on a substrate with straight sidewalls.

SUMMARY

One or more embodiments of the disclosure are directed to methods of processing a substrate having a first material and a second material. A third material is deposited on the first material and the second material so that the third material grows selectively on one of the first material and the second material to form a feature having a top and at least one sidewall. A conformal film of a fourth material is deposited on the third material so that the top and the at least one sidewall of the feature have a layer of the fourth material thereon. The fourth material is selectively removed from the top of the feature so that at least some of the fourth material remains on the sidewalls of the feature. The steps are repeated to grow the feature to a desired thickness.

One or more embodiments of the disclosure are directed to methods of processing a substrate having a first surface comprising a metal portion and a dielectric portion. A material is deposited on the first surface so that the material grows selectively on one of the metal portion and the dielectric portion to form a feature having a top and sidewalls. A conformal film is deposited on the feature so that the top and sidewalls of the feature are covered by the conformal film. The conformal film is selectively removed from the top of the feature so that at least some of the conformal film remains on the sidewalls of the feature. The steps are repeated to grow the feature to a desired thickness.

Some embodiments further comprise removing the fourth material, or the remaining conformal film, from the sidewalls of the feature In one or more embodiments, the feature of desired thickness has sidewalls substantially perpendicular to adjacent surface. In some embodiments, the sidewall is within about 10° of perpendicular. In some embodiments, the feature of desired thickness has an aspect ratio greater than 3. In one or more embodiments, the feature has a width that varies less than about 10% relative along the thickness of the feature.

One or more embodiments are directed to methods of processing a substrate. A substrate is placed in a processing chamber, the substrate having a surface with a metal portion and a dielectric portion, the metal portion comprising metallic copper. A feature is grown on the metal portion, the feature including sidewalls and a top, the feature being grown by (a) depositing a cobalt film on the first surface so that the cobalt film selectively deposits on the metal portion over the dielectric portion forming the feature; (b) depositing a manganese nitride conformal film on the feature so that the top and sidewalls of the feature have a coating of manganese nitride; (c) selectively removing the manganese nitride film from the top of the feature so that at least some of the manganese nitride film remains on the sidewalls of the feature; and repeating (a) through (c) to grow the feature to a desired thickness.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1A:
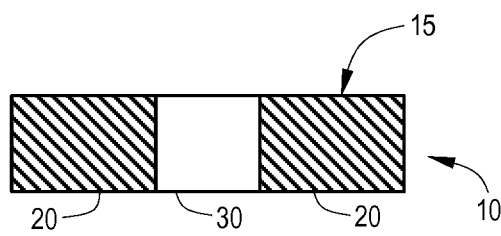
FIGS. 1A through 1G illustrates an exemplary process sequence for the formation of a feature in accordance with one or more embodiment of the disclosure.

Embodiments of the disclosure provide an improved process for depositing features on a substrate with straight sidewalls. The deposition rates of CVD/ALD processes are strongly dependent on the substrate. One example is the deposition rate of CVD cobalt on manganese nitride (MnN) vs. copper. The deposition rate is much lower on manganese nitride than copper. By utilizing this deposition rate difference, the inventors have discovered that different areas of a surface can be "poisoned" to fine tune the final shape of the feature. Accordingly, one or more embodiments of the disclosure are directed to patterning methods without the need for an etch or lithography step by substantially preventing the deposition on the sidewalls of the feature as the feature is being formed.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

Before describing several exemplary embodiments of the disclosure, it is to be understood that the disclosure is not limited to the details of construction or process steps set forth in the following description. The disclosure is capable of other embodiments and of being practiced or being carried out in various ways.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

With reference to FIGS. 1A through 1G, one or more embodiments of the disclosure are directed to methods of processing a substrate 10. The substrate has a first surface 15 which is shown as the a top surface, but it will be understood by those skilled in the art that during processing, the substrate surface can be facing in any direction depending on the processing equipment being employed. For descriptive purposes only, the first surface 15 may be referred to as the top surface as being toward the top of the page in the Figures.

The first surface 15 has a first material 20 and a second material 30. The first material 20 and second material 30 are different materials, in some manner. While the first material 20 and second material 30 may have similar components, the function and/or composition as a whole are different. In some embodiments, the first material 20 is a metal portion and the second material 30 is a dielectric portion. In one or more embodiments, the first material 20 is a dielectric portion and the second material 30 is a metal portion. The first material 20 and the second material 30 can be other types of materials not strictly considered metal or dielectric, or having the purpose of a metal or dielectric portion.

Figure 1B:
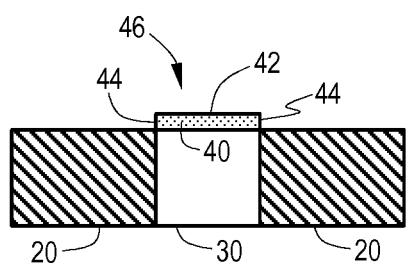

A third material 40 is deposited on the first material 20 and/or the second material 30. The third material 40 is selectively deposited on one or more of the first material 20 and the second material 30. As used this specification and the appended claims, the terms "selectively deposited" and "substantially only deposited" means that the deposition reaction occurs either more rapidly or more energetically favorably to the extent that the growth rate on the non-selective area is less than about 10%, or less than about 5%, or less than about 4%, or less than about 3%, or less than about 2% or less than about 1% of the growth rate on the selective area. In some embodiments, the terms "selectively deposited" and "substantially only deposited" means that the deposition occurs at a ratio of greater than about 10:1, or greater than about 20:1, or greater than about 25:1, or greater than about 33:1, or greater than about 50:1 or greater than about 100:1 on the selective area vs. the non-selective area. Referring to FIG. 1B, the third material 40 is deposited only, or substantially only deposited, on the second material 30. However, it will be understood by those skilled in the art that the first material 20 and second material 30 can be reversed or the third material 40 can deposit selectively on the first material 20 instead. In some embodiments, the third material 40 is any material that is different from the first material 20 and the second material 30.

The growth of the third material 40 on the second material 30 (or first material 20) results in a feature 46 formed on the second material 30 (or first material 20) as shown in FIG. 1B. The feature 46 shown in the Figures has a top 42, also referred to as a top surface, and sidewalls 44 on either side. While a feature with two sidewalls 44 are shown, it will be understood by those skilled in the art that a feature with just one sidewall can also be formed, for example, a film deposited on the side of another surface. Here, the growth of the feature 46 begins with sidewalls 44 that are substantially perpendicular to the first surface 15 of the substrate 10, or substantially perpendicular to the second material 30 surface upon which the feature 46 is grown.

In some embodiments, the feature 46 is grown, or deposited, on a metal film. In one or more embodiments, the feature 46 is grown, or deposited, on a dielectric film. Stated differently, in some embodiments, the feature 46 is made from a material deposited on one or more of a dielectric portion or metal portion which makes up the first surface of a substrate. Where depositing a material on the first surface of the substrate is referred to, it will be understood that the first surface of the substrate can be any portion or the entire substrate surface.

FIG. 1B shows a thickness of the third material 40 forming the beginnings of a feature 46 on the surface of the substrate over the second material 30. The third material 40 shown in the Figures is located only on the second material 30 for clarity purposes. Those skilled in the art will understand that a small amount of the third material 40 may also form on the first material 20 in FIG. 1B as described above. The formation of the feature 46 is selective to the second material 30 over the first material 20 in the examples shown in the Figures. The third material 40 can be deposited by any suitable technique known to those skilled in the art including, but not limited to, CVD, ALD and PVD processes.

A film can be deposited by atomic layer deposition (ALD) by sequentially exposing a surface to a precursor and a reactant. The terms "precursor", "reactant", "reactive gas" and the like are used interchangeably to mean any species which is capable of reacting with the substrate surface (e.g., chemisorption or reduction of a species on the surface). The cyclic process of exposure to a precursor and reactant results in a single ALD layer being formed. An ALD film generally is made up of more than one deposited layer. Thus, a substrate can be sequentially exposed to the first precursor and the reactant until a film of desired thickness is formed. For example, a 5 Å thick film might take 10 ALD cycles with each cycle being represented by a single exposure to the first precursor and a single exposure to the second precursor. In some embodiments, the thickness of the film formed is less than about 200 Å, 100 Å, 75 Å, 50 Å, 40 Å, 30 Å, 25 Å, 20 Å, 15 Å, 10 Å or 5 Å. The number of process cycles in some embodiments, is less than about 400, 200, 150, 100, 80, 60, 50, 40, 30, 20, 10, or 5 for each deposition of the third material 40 before moving to the fourth material.

Figure 1C:
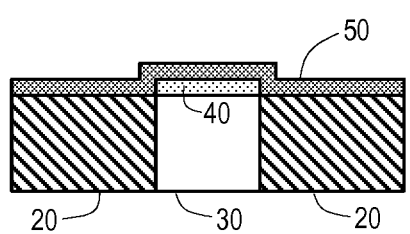

Referring to FIG. 1C, after a thickness of the third material 40 has been grown, a conformal film of a fourth material 50 is deposited on the third material 40 so that the top 42 and at least one sidewall 44 has a layer of the fourth material 50 thereon. The fourth material 50 can be any suitable material that provides a surface that is unfavorable for additional deposition of the third material 40. The fourth material 50 can be deposited by any suitable technique known to those skilled in the art including, but not limited to, CVD, ALD and PVD processes. The fourth material 50 shown in FIG. 1C is deposited evenly across both the third material 40 of the feature 46 and the first material 20. This is merely illustrative of one exemplary embodiment. In some embodiments, the fourth material 50 is selectively deposited on the third material 40 so that a small amount of the fourth material 50 is deposited on the first material 20 relative to the third material 40 of the feature 46 being formed.

Figure 1D:
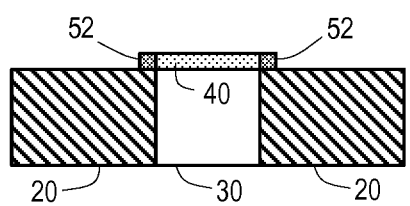
Figure 1E:
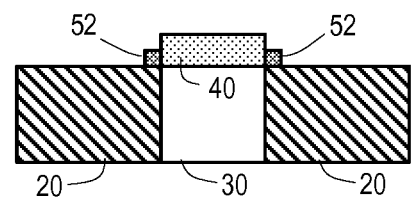

Referring to FIG. 1D, the conformal film of the fourth material 50 is then selectively removed from the top 42 of the feature 46. The removal process is directional in that the flat surfaces at the top 42 of the feature 46 and the flat surface at the first material 20 are affected leaving at least some of the fourth material 52 on the at least one sidewall 44 of the feature 46. Leaving a small amount of the fourth material 52 on the sidewalls 44 of the feature 46 forms a passivation layer which will prevent or minimize further deposition of the third material on the sidewalls 44 in subsequent processing, as described further below. in some embodiments, the fourth material substantially prevents further deposition on the sidewalls 44 of the feature 46. As used in this specification and the appended claims, the term "substantially prevents further deposition" means that the amount of additional material deposited on the sidewalls is less than about 10%, or less than about 9%, or less than about 8%, or less than about 7%, or less than about 6%, or less than about 5%, or less than about 4%, or less than about 3%, or less than about 2%, or less than about 1% of the amount that would be deposited without the passivation layer on the sidewalls 44.

The conformal film of the fourth material 50 can be selectively removed by any suitable directionally controllable process. For example, an anisotropic etch, a directional plasma etch, a biased plasma etch and selective re-sputtering to name a few. The directional control of the removal process does not need to be exactly perpendicular to the flat surfaces of the different materials (i.e., parallel to the sidewalls 44 of the feature 46 and perpendicular to the top 42 of the feature 46). The directional control is sufficient to remove the conformal film from the flat surfaces and leave at least some of the fourth material 52, enough to prevent further growth, on the sidewalls 44 of the feature 46. In some embodiments, substantially all of the fourth material 50 is removed from the top surface of the areas next to the deposition feature-deposition region. For example, if the feature is being deposited on the second material, then the area next to the feature would be the first material. As used in this specification and the appended claims, the term "substantially all" used in this context means that at least about 75% of the amount of the partial layer is removed. In some embodiments, "substantially all" means that at least about 80%, 85%, 90% or 95% of the partial layer is removed.

Figure 1F:
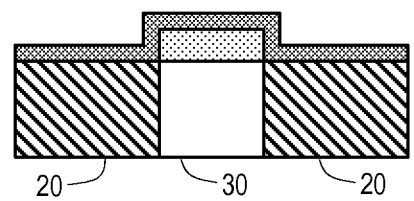
Figure 1G:
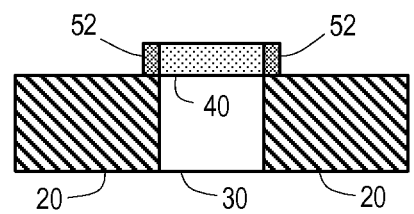

After removing the fourth material 50 from the top 42 of the feature 46, deposition of the third material 40 is repeated to grow the height of the feature 46. This can be seen in FIG. 1E, where the third material 40 forming the feature 46 is now taller than the fourth material 52 along the sidewall 44 of the feature 46. Another film of the fourth material 50 is deposited over the feature 46 again, as shown in FIG. 1F and selectively directionally removed to leave the sidewalls 44 of the feature 46 with some of the fourth material 52 as shown in FIG. 1G.

Figure 2:
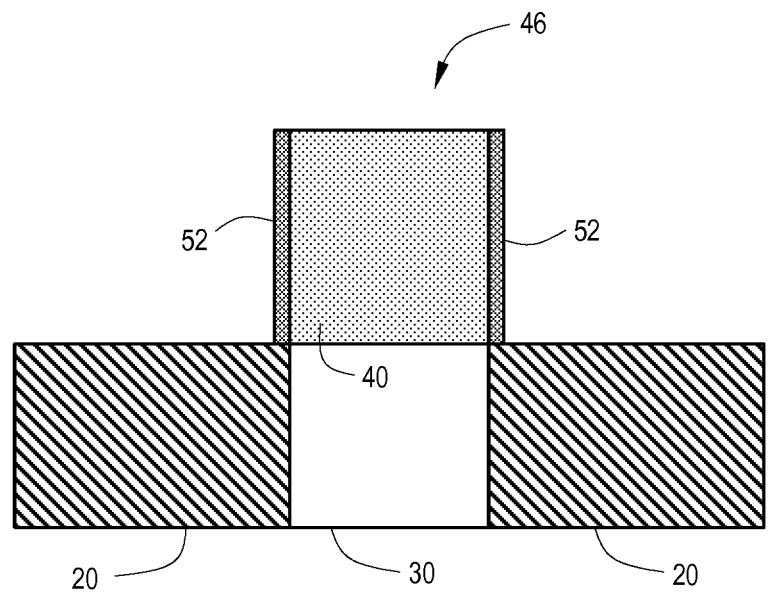
FIG. 2 shows a feature formed in accordance with one or more embodiment of the disclosure.
Figure 3:
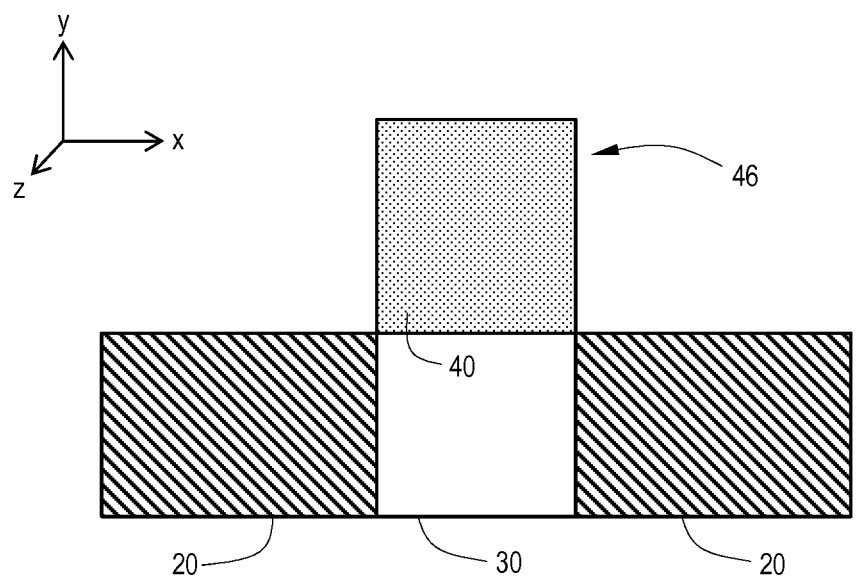
FIG. 3 shows a feature formed in accordance with one or more embodiment of the disclosure.

The deposition of the third material 40, fourth material 50 and directional removal are repeated until a feature of the desired height is formed, as shown in FIG. 2. At this point, there is a feature 46 with substantially straight sidewalls 44 that are substantially perpendicular to the underlying surface (in this case, the second material 30). The remaining fourth material 52 along the sidewalls 44 of the feature 46 may be left in position or removed, as shown in FIG. 3. The final removal step of the fourth material can be done by any suitable etching technique and does not need to be directional.

Referring to FIG. 3, the sidewalls 44 of the feature 46 are shown substantially straight and perpendicular to the underlying surface (also referred to as the adjacent surface). The underlying, or adjacent, surface is the surface upon which the feature has been deposited. The feature 46 does not need to be both straight and perpendicular, but straight and/or perpendicular. As used in this specification and the appended claims, the term "substantially straight" as used in this respect means that the width of the feature 46 varies by less than about 5% relative along the thickness (height) of the feature 46. In some embodiments, the width of the feature 46 varies by less than about 4%, or about 3%, or about 2% or about 1% along the height of the feature. Referring to FIG. 3, the width of the feature is along the x-axis and the height of the feature is along the y-axis with the z-axis representing the length of the feature. As used in this specification and the appended claims, the term "perpendicular" used to describe the sidewall orientation relative to the surface of the substrate means within the range of about 80° to about 100°, or in the range of about 85° to about 95°, or in the range of about 86° to about 94°, or in the range of about 87° to about 93°, or in the range of about 88° to about 92°, or in the range of about 89° to about 91°. For example, if the substrate surface lies exactly on the x-z plane, a perfect 90° perpendicular would lie along the y-axis.

The third material 40 which makes up the feature 46 can be deposited in steps depending on the desired thickness. The desired thickness being the total thickness (height along the y-axis) of the feature 46 after all layers of the third material 40 have been deposited. In one or more embodiments, the total thickness is less than about 500 nm, or less than about 400 nm, or less than about 300 nm, or less than about 200 nm, or less than about 100 nm, or less than about 50 nm. To prevent or minimize mushrooming of the feature during growth, the feature can be grown in steps so that the sidewall can be coated with the fourth material 50 as the feature growths. In some embodiments, less than about 25 Å of the third material 40 forming the feature 46 is deposited before depositing the fourth material 50 thereon. In one or more embodiments, less than about 20 Å, or less than about 15 Å, or less than about 10 Å, or less than about 9 Å, or less than about 8 Å, or less than about 7 Å of the third material is deposited between depositions of the fourth material and directional etching of the conformal film of the fourth material from the top of the feature.

The aspect ratio of the feature after reaching the desired thickness is greater than about 3. As used in this specification and the appended claims, the term "aspect ratio" means the ratio of the height (along the y-axis) to the width (along the x-axis) of the feature, as shown by the coordinates in FIG. 3. In one or more embodiments, the aspect ratio of the desired thickness of the feature is greater than about 4, or greater than about 5, or greater than about 6, or greater than about 7, or greater than about 8, or greater than about 9, or greater than about 10, or greater than about 15, or greater than about 20, or greater than about 25, or greater than about 30, or greater than about 40, or greater than about 50.

As an example, a substrate surface having a metal portion and a dielectric portion can be placed into the processing area of a process chamber. The metal portion of the substrate can comprise copper metal as a first material. The dielectric portion of the substrate can comprise a dielectric as the second material. A feature is grown on the metal portion of the substrate by depositing a cobalt film on the surface of the copper. After an amount of the copper film has been deposited, a manganese nitride conformal film is deposited on the feature so that the top and sidewalls of the feature are coated with the manganese nitride. The manganese nitride film is selectively removed from the top of the feature so that at least some of the manganese nitride film remains on the sidewalls of the feature. The remaining manganese nitride film on the sidewalls substantially preventing growth of additional cobalt on the sidewalls of the feature to prevent or minimize the mushrooming of the feature during growth. The cobalt film is thickened by depositing more cobalt onto the feature with the manganese nitride coated sidewalls. After an amount of the cobalt has been deposited, the conformal film of manganese nitride is deposited again over the feature and then again selectively removed. This process is repeated until the feature has reached the desired height. The manganese nitride film on the sidewalls of the feature can be left in place or removed by any suitable etching process Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of processing a substrate having a first material comprising a metal and a second material comprising a dielectric, the method comprising:
   (a) depositing a third material on the first material and second material so that the third material grows selectively on the first material to form a feature having a top and at least one sidewall;
   (b) depositing a conformal film of a fourth material on the third material so that the top and the at least one sidewall of the feature have a layer of fourth material thereon;
   (c) selectively removing the fourth material from the top of the feature so that at least some of the fourth material remains on the sidewalls of the feature; and
   (d) repeating (a) through (c) to grow the feature to a predetermined thickness.

2. The method of claim 1, further comprising (e) removing the fourth material from the at least one sidewall of the feature.

3. The method of claim 1, wherein less than about 10 Å of the third material is deposited before depositing the conformal film of the fourth material.

4. The method of claim 1, wherein selectively removing the fourth material from the top of the feature comprises exposing the fourth material to a directional plasma etch.

5. The method of claim 1, wherein the feature of predetermined thickness has sidewalls substantially perpendicular to adjacent surface.

6. The method of claim 5, wherein the sidewall is within about 10° of perpendicular.

7. The method of claim 1, wherein the fourth material substantially prevents further deposition of third material on the at least one sidewall of the feature.

8. The method of claim 1, wherein the first material comprises copper metal, the second material comprises a dielectric and the feature is formed on the first material.

9. The method of claim 8, wherein the third material comprises cobalt metal.

10. The method of claim 9, wherein the fourth material comprises manganese nitride (MnN).

11. The method of claim 1, wherein the feature of predetermined thickness has an aspect ratio greater than 3.

12. The method of claim 1, wherein the feature has a width that varies less than about 10% relative along the thickness of the feature.

13. The method of claim 1, wherein one or more of the third material and the fourth material is deposited by atomic layer deposition.

14. A method of processing a substrate having a first surface comprising a metal portion and a dielectric portion, the method comprising:
(a) depositing a material on the first surface so that the material grows selectively on the metal portion to form a feature having a top and sidewalls;
(b) depositing a conformal film on the top and sidewalls of the feature;
(c) selectively removing the conformal film from the top of the feature so that at least some of the conformal film remains on the sidewalls of the feature; and
(d) repeating (a) through (c) to grow the feature to a predetermined thickness.

15. The method of claim 14, further comprising (e) removing the conformal film from the sidewalls of the feature after the feature is grown to the predetermined thickness.

16. The method of claim 14, wherein less than about 10 Å of the third material is deposited before depositing the conformal film of the fourth material.

17. The method of claim 14, wherein selectively removing the conformal film from the top of the feature comprises exposing the conformal film to a directional plasma etch.

18. The method of claim 14, wherein the feature of predetermined thickness has sidewalls substantially perpendicular to an adjacent surface.

19. A method of processing a substrate, the method comprising:
placing the substrate in a processing chamber, the substrate having a surface with a metal portion and a dielectric portion, the metal portion comprising metallic copper; and
growing a feature on the metal portion, the feature including sidewalls and a top, the feature being grown by
(a) depositing a cobalt film on the first surface so that the cobalt film selectively deposits on the metal portion over the dielectric portion forming the feature;
(b) depositing a manganese nitride conformal film on the feature so that the top and sidewalls of the feature have a coating of manganese nitride;
(c) selectively removing the manganese nitride film from the top of the feature so that at least some of the manganese nitride film remains on the sidewalls of the feature; and
(d) repeating (a) through (c) to grow the feature to a predetermined thickness.

\* \* \* \* \*